(12) United States Patent
So et al.

(10) Patent No.: US 12,069,908 B2
(45) Date of Patent: Aug. 20, 2024

(54) DISPLAY DEVICE

(71) Applicant: Samsung Display Co., LTD., Yongin-si (KR)

(72) Inventors: Mi Yeon So, Cheongju-si (KR); Hye Song Kwun, Bucheon-si (KR); Yong Chul Kim, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 164 days.

(21) Appl. No.: 17/228,100

(22) Filed: Apr. 12, 2021

(65) Prior Publication Data
US 2021/0320165 A1    Oct. 14, 2021

(30) Foreign Application Priority Data
Apr. 13, 2020   (KR) .................. 10-2020-0044519

(51) Int. Cl.
*H10K 59/131*   (2023.01)
*H10K 50/844*   (2023.01)

(52) U.S. Cl.
CPC ......... *H10K 59/131* (2023.02); *H10K 50/844* (2023.02)

(58) Field of Classification Search
CPC ............................ H10K 59/131; H10K 50/844
See application file for complete search history.

(56) References Cited

U.S. PATENT DOCUMENTS

| | | | |
|---|---|---|---|
| 2015/0228927 A1* | 8/2015 | Kim | H10K 50/805 257/40 |
| 2017/0033312 A1* | 2/2017 | Kim | H10K 59/131 |
| 2018/0159074 A1* | 6/2018 | Kim | H10K 50/844 |
| 2019/0196619 A1* | 6/2019 | Baek | G06F 3/04164 |
| 2019/0237690 A1* | 8/2019 | Park | H10K 10/476 |
| 2019/0252482 A1* | 8/2019 | Choi | H01L 27/124 |
| 2019/0341439 A1* | 11/2019 | Choi | H10K 59/122 |
| 2020/0006461 A1* | 1/2020 | Cho | H10K 59/122 |

FOREIGN PATENT DOCUMENTS

| | | |
|---|---|---|
| KR | 10-1452583 | 10/2014 |
| KR | 10-2017-0015629 | 2/2017 |
| KR | 10-2020-0003332 | 1/2020 |

* cited by examiner

*Primary Examiner* — Vongsavanh Sengdara
(74) *Attorney, Agent, or Firm* — KILE PARK REED & HOUTTEMAN PLLC (57) ABSTRACT

A display device may include a substrate including a display area and a peripheral area adjacent to the display area, fan-out lines disposed in the peripheral area of the substrate, an insulation layer disposed on the fan-out lines, at least one first dam disposed on the insulation layer in the peripheral area, the at least one first dam surrounding the display area, a second dam disposed on the insulation layer in the peripheral area, the second dam surrounding the at least one first dam, and a blocking pattern disposed between the insulation layer and an edge of the second dam adjacent to the at least one first dam.

23 Claims, 8 Drawing Sheets

DISPLAY DEVICE

CROSS-REFERENCE TO RELATED APPLICATION(S)

This application claims priority to and benefits of Korean Patent Application No. 10-2020-0044519 under 35 U.S.C. § 119 filed on Apr. 13, 2020 in the Korean Intellectual Property Office, the entire contents of which are incorporated herein by reference.

BACKGROUND

1. Technical Field

Embodiments relate to a display device and to a display device in which dams are formed in a peripheral area.

2. Description of the Related Art

A display device may include a display area in which an image may be displayed and a peripheral area that may be a non-display area surrounding the display area. Pixels, which may be the smallest units for displaying the image, may be disposed in the display area. Each of the pixels may include a pixel circuit and a light-emitting element electrically connected to the pixel circuit. Fan-out lines for providing signals and voltages to the pixels may be disposed in the peripheral area.

Dams may be formed in the peripheral area to prevent overflow of organic and/or inorganic materials in the process of forming an encapsulation layer covering or overlapping the light-emitting element. During the manufacturing process of the display device, cracks may occur in the encapsulation layer corresponding to edges of the dams, and the fan-out lines may be corroded when moisture flows into the display device from the outside through the cracks.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device in which the corrosion of fan-out lines disposed in a peripheral area may be prevented.

A display device according to an embodiment may include a substrate including a display area and a peripheral area adjacent to the display area; fan-out lines disposed in the peripheral area of the substrate; an insulation layer disposed on the fan-out lines; at least one first dam disposed on the insulation layer in the peripheral area, the at least one first dam surrounding the display area; a second dam disposed on the insulation layer in the peripheral area, the second dam surrounding the at least one first dam; and a blocking pattern disposed between the insulation layer and an edge of the second dam adjacent to the at least one first dam.

In an embodiment, the second dam may contact the blocking pattern.

In an embodiment, a material of the blocking pattern may be different from a material of the fan-out lines.

In an embodiment, the blocking pattern may include at least one of aluminum (Al) and titanium (Ti), and the fan-out lines may include molybdenum (Mo).

In an embodiment, the display device may further include a light-emitting element disposed on the substrate in the display area; and an encapsulation layer overlapping the light-emitting element, the at least one first dam, and at least a portion of the second dam and, the encapsulation layer including a first inorganic encapsulation layer; a second inorganic encapsulation layer disposed on the first inorganic encapsulation layer; and an organic encapsulation layer disposed between the first inorganic encapsulation layer and the second inorganic encapsulation layer.

In an embodiment, the first inorganic encapsulation layer and the second inorganic encapsulation layer may be disposed between the at least one first dam and the second dam.

In an embodiment, an edge of the encapsulation layer may be disposed on the second dam.

In an embodiment, an edge of the organic encapsulation layer may be disposed on the at least one first dam.

In an embodiment, the display device may further include an active pattern disposed on the substrate in the display area; a first gate pattern disposed on the active pattern; a second gate pattern disposed on the first gate pattern; a first data pattern disposed on the second gate pattern; and a second data pattern disposed between the first data pattern and the light-emitting element.

In an embodiment, the blocking pattern and at least one of the first data pattern and the second data pattern may be disposed on a same layer.

In an embodiment, the fan-out lines and at least one of the first gate pattern and the second gate pattern may be disposed on a same.

A display device according to an embodiment may include a substrate including a display area and a peripheral area adjacent to the display area; fan-out lines disposed in the peripheral area of the substrate; at least one first dam disposed on the fan-out lines in the peripheral area, the at least one first dam surrounding the display area; a second dam disposed on the fan-out lines in the peripheral area, the second dam surrounding the at least one first dam; and a blocking pattern disposed between the fan-out lines and the second dam, the blocking pattern overlapping an edge of the second dam adjacent to the at least one first dam in a plan view.

In an embodiment, the display device may further include a first power line disposed on the substrate in the peripheral area, wherein the blocking pattern may be electrically connected to the first power line.

In an embodiment, the blocking pattern and the first power line may be disposed on a same layer.

In an embodiment, the blocking pattern may be integral with the first power line.

In an embodiment, the blocking pattern and the first power line may be disposed on a different layer.

In an embodiment, the blocking pattern may be electrically connected to the first power line through a contact hole.

In an embodiment, the blocking pattern may protrude from the first power line in the plan view.

In an embodiment, the display device may further include a second power line disposed on the substrate in the peripheral area, and the blocking pattern may be spaced apart from the second power line.

In an embodiment, the display device may further include a light-emitting element disposed on the substrate in the display area; and an encapsulation layer overlapping the light-emitting element, the at least one first dam, and at least a portion of the second dam, the encapsulation layer including a first inorganic encapsulation layer; a second inorganic encapsulation layer disposed on the first inorganic encapsulation layer; and an organic encapsulation layer disposed between the first inorganic encapsulation layer and the second inorganic encapsulation layer. The first inorganic encapsulation layer and the second inorganic encapsulation layer may be disposed between the at least one first dam and the second dam.

The display device according to the embodiments may include the blocking pattern disposed between the fan-out lines and the edge of the second dam which may be adjacent to the first dam and overlapping the edge of the second dam in a plan view, so that the blocking pattern may block moisture to prevent the fan-out lines from being corroded although the moisture may flow into the display device through cracks formed in the inorganic encapsulation layers corresponding to the edge of the second dam.

BRIEF DESCRIPTION OF THE DRAWINGS

Illustrative, non-limiting embodiments will be more clearly understood from the following detailed description taken in conjunction with the accompanying drawings in which.

DETAILED DESCRIPTION OF THE EMBODIMENTS

Hereinafter, display devices in accordance with embodiments will be explained in detail with reference to the accompanying drawings.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

An expression used in the singular encompasses the expression of the plural, unless it has a clearly different meaning in the context.

In the specification, it is to be understood that the terms such as "including," "having," and "comprising" and variations thereof are intended to indicate the existence of the features or components disclosed in the specification, and are not intended to preclude the possibility that one or more other features or components may exist or may be added.

It will also be understood that when a layer is referred to as being "on" another layer or substrate, it may be directly on the other layer or substrate, or intervening layers may also be present. In contrast, when an element is referred to as being "directly on" another element, there are no intervening elements present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

In addition, terms such as "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
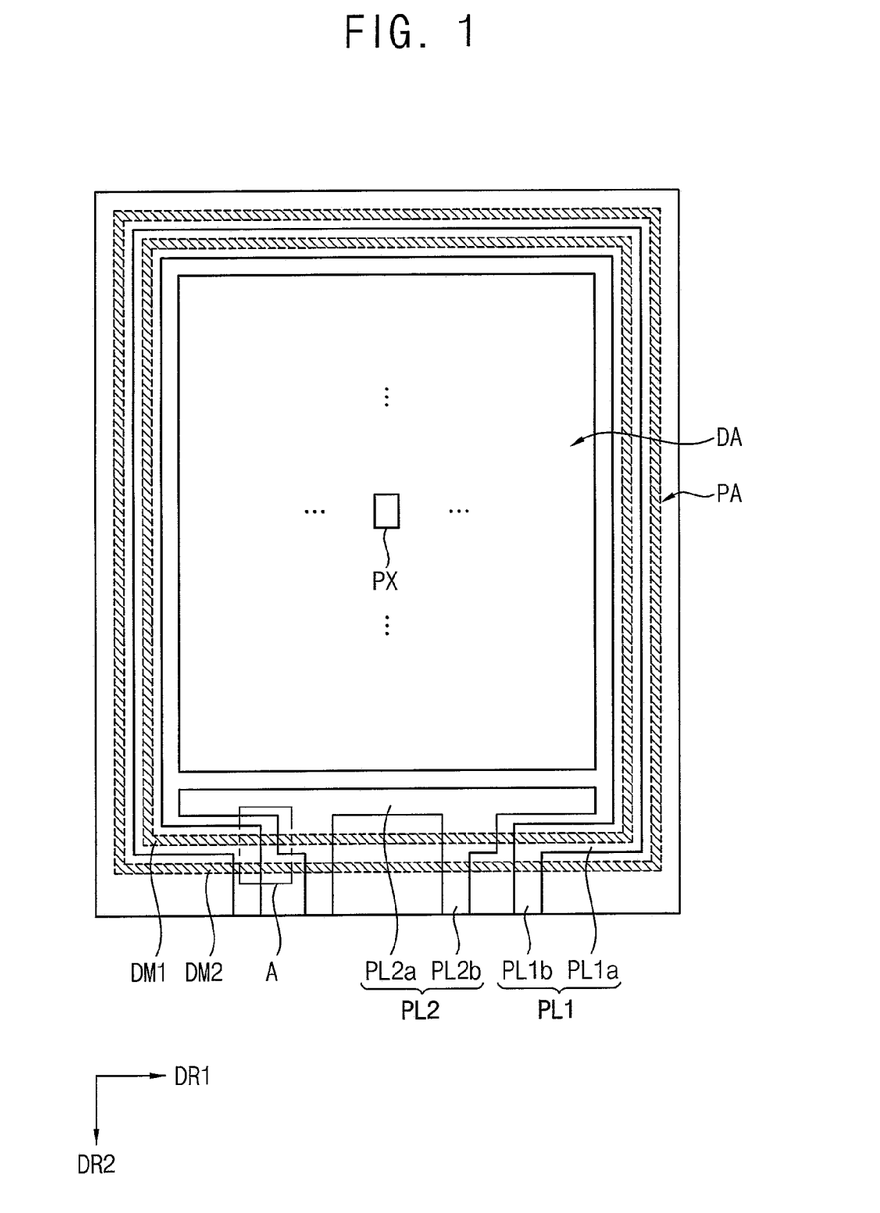
FIG. 1 is a plan view illustrating a display device according to an embodiment.

FIG. 1 is a plan view illustrating a display device according to an embodiment.

Referring to FIG. 1, a display device according to an embodiment may include a display area DA and a peripheral area PA. The peripheral area PA may be adjacent to the display area DA. For example, the peripheral area PA may surround the display area DA.

Pixels PX may be disposed in the display area DA. The pixels PX may be arranged or disposed along a first direction DR1 and a second direction DR2 crossing or intersecting the first direction DR1 in a matrix form. Each of the pixels PX may emit light having a predetermined color. An image may be displayed in the display area DA based on the light emitted from each of the pixels PX.

A first power line PL1 and a second power line PL2 may be disposed in the peripheral area PA. Each of the first power line PL1 and the second power line PL2 may supply a power voltage to the pixels PX. For example, the first power line PL1 may supply a first power voltage to the pixels PX, and the second power line PL2 may supply a second power voltage to the pixels PX.

The first power line PL1 may include a first portion PL1a substantially surrounding the display area DA and a second portion PL1b electrically connected to an end of the first portion PL1a and extending along the second direction DR2. The second portion PL1b may be electrically connected to a first power source disposed on the outside, and may transmit the first power voltage to the first portion PL1a.

The second power line PL2 may include a first portion PL2a disposed in the second direction DR2 from the display area DA and extending along the first direction DR1 and a second portion PL2b electrically connected to the first portion PL2a and extending along the second direction DR2. The second portion PL2b may be electrically connected to a second power source disposed on the outside, and may transmit the second power voltage to the first portion PL2a.

At least one first dam DM1 and a second dam DM2 may be disposed in the peripheral area PA. The first dam DM1 may surround or be adjacent to the display area DA. The second dam DM2 may be spaced apart from the first dam DM1, and may surround or be adjacent to the first dam DM1. In an embodiment, the first dam DM1 may include dams surrounding the display area DA and spaced apart from each other.

The first dam DM1 may block an organic material of an organic encapsulation layer of an encapsulation layer for sealing the display area DA from flowing out of the first dam DM1. The second dam DM2 may prevent an inorganic encapsulation layer of the encapsulation layer from being formed outside the second dam DM2.

Figure 2:
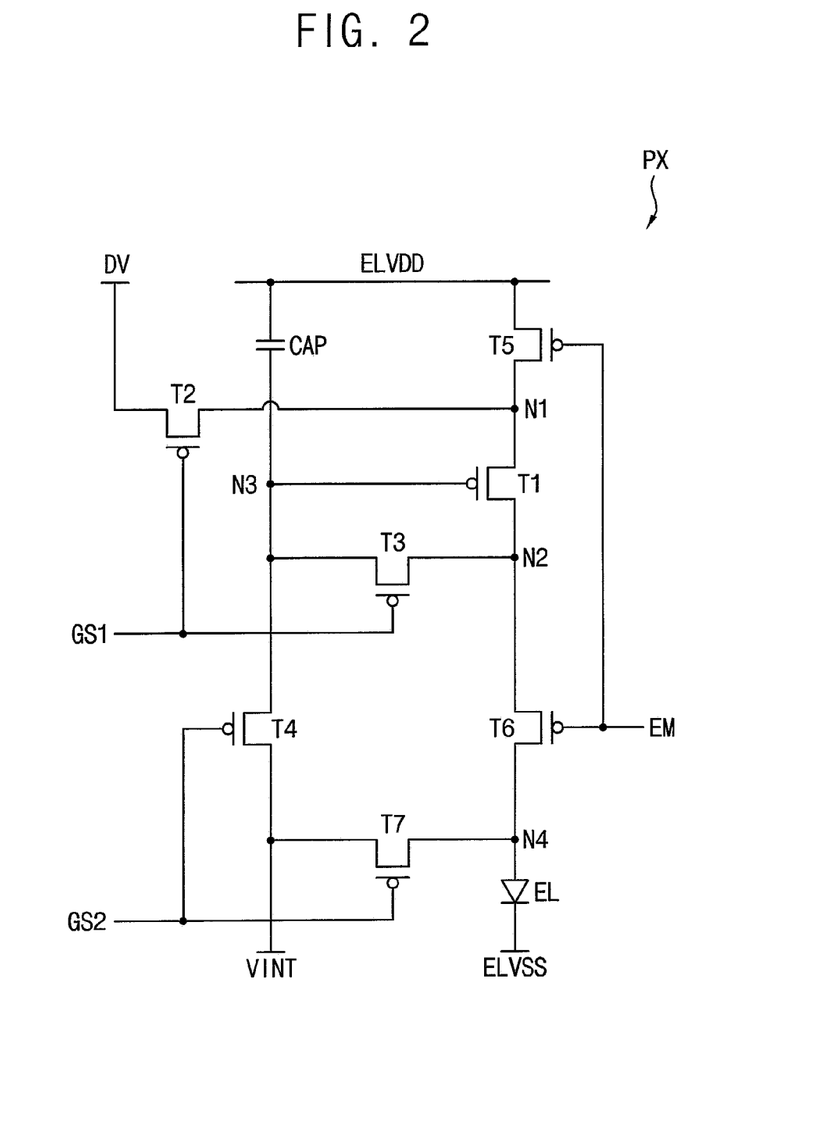
FIG. 2 is an equivalent circuit diagram illustrating a pixel according to an embodiment.

FIG. 2 is an equivalent circuit diagram illustrating a pixel according to an embodiment. For example, FIG. 2 may illustrate the pixel PX in FIG. 1.

Referring to FIG. 2, a pixel PX according to an embodiment may include a first transistor T1, a second transistor T2, a third transistor T3, a fourth transistor T4, a fifth transistor T5, a sixth transistor T6, a seventh transistor T7, a capacitor CAP, and a light-emitting element EL.

The first transistor T1 may be electrically connected between a first node N1 and a second node N2. The first transistor T1 may include a source electrode electrically connected to the first node N1, a drain electrode electrically connected to the second node N2, and a gate electrode electrically connected to a third node N3.

The second transistor T2 may be electrically connected between a data line and the first node N1. The second transistor T2 may include a source electrode receiving a data voltage DV, a drain electrode electrically connected to the first node N1, and a gate electrode receiving a first gate signal GS1.

The third transistor T3 may be electrically connected between the second node N2 and the third node N3. The third transistor T3 may include a source electrode electrically connected to the third node N3, a drain electrode electrically connected to the second node N2, and a gate electrode receiving the first gate signal GS1.

The fourth transistor T4 may be electrically connected between an initialization voltage line and the third node N3. The fourth transistor T4 may include a source electrode receiving an initialization voltage VINT, a drain electrode electrically connected to the third node N3, and a gate electrode receiving a second gate signal GS2.

The fifth transistor T5 may be electrically connected between the second power source providing the second power voltage ELVDD and the first node N1. The fifth transistor T5 may include a source electrode receiving the second power voltage ELVDD, a drain electrode electrically connected to the first node N1, and a gate electrode receiving an emission control signal EM.

The sixth transistor T6 may be electrically connected between the second node N2 and a fourth node N4. The sixth transistor T6 may include a source electrode electrically connected to the second node N2, a drain electrode electrically connected to the fourth node N4, and a gate electrode receiving the emission control signal EM.

The seventh transistor T7 may be electrically connected between the initialization voltage line and the fourth node N4. The seventh transistor T7 may include a source electrode receiving the initialization voltage VINT, a drain electrode electrically connected to the fourth node N4, and a gate electrode receiving the second gate signal GS2.

The capacitor CAP may be electrically connected between the second power source and the third node N3. The capacitor CAP may include a first capacitor electrode electrically connected to the third node N3 and a second capacitor electrode receiving the second power voltage ELVDD.

The light-emitting element EL may be electrically connected between the fourth node N4 and the first power source providing the first power voltage ELVSS. The first power voltage ELVSS may be less than the second power voltage ELVDD. The light-emitting element EL may include a first electrode electrically connected to the fourth node N4 and a second electrode receiving the first power voltage ELVSS.

In an embodiment, each of the first to seventh transistors T1, T2, T3, T4, T5, T6, and T7 may be a PMOS (P-type metal-oxide-silicon) transistor. However, the disclosure is not limited thereto, and in an embodiment, each of the first to seventh transistors T1, T2, T3, T4, T5, T6, and T7 may be an NMOS transistor or a CMOS (complementary metal-oxide-silicon) transistor.

FIG. 2 illustrates an embodiment in which the pixel PX may include seven transistors and one capacitor, however, the disclosure is not limited thereto, and in an embodiment, the pixel PX may include two to six or eight or more transistors and/or two or more capacitors.

Figure 3:
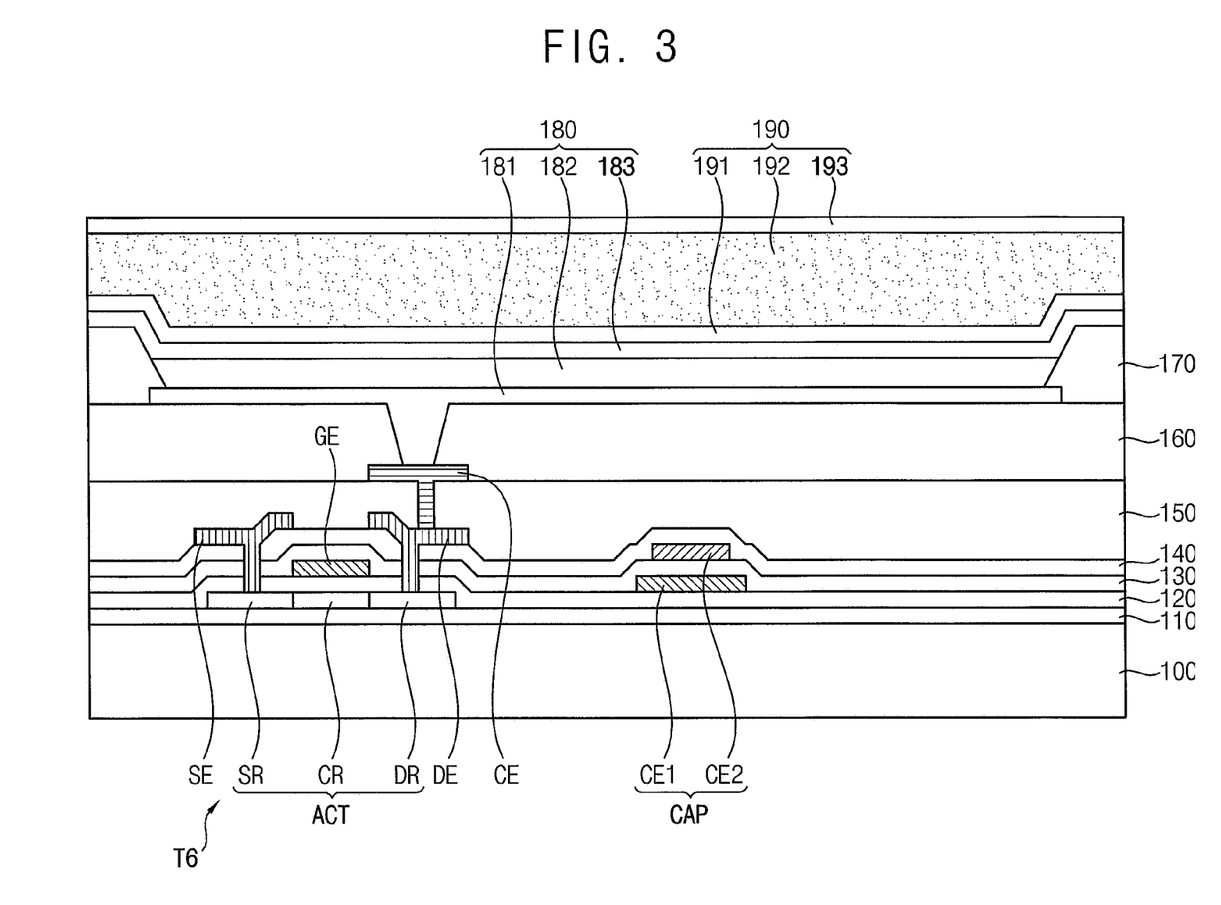
FIG. 3 is a schematic cross-sectional view illustrating a display area according to an embodiment.

FIG. 3 is a schematic cross-sectional view illustrating a display area according to an embodiment. For example, FIG. 3 may illustrate the display area DA in FIG. 1.

Referring to FIGS. 1, 2, and 3, the display device may include a substrate 100, a buffer layer 110, an active pattern ACT, a first gate insulation layer 120, a first gate pattern, a second gate insulation layer 130, a second gate pattern, an insulation layer 140, a first data pattern, a first planarization layer 150, a second data pattern, a second planarization layer 160, a pixel defining layer 170, a light-emitting element 180, and an encapsulation layer 190 which may be disposed in the display area DA.

The substrate 100 may be a transparent insulating substrate. For example, the substrate 100 may be formed of glass, quartz, plastic, or the like within the spirit and the scope of the disclosure.

The buffer layer 110 may be disposed on the substrate 100. The buffer layer 110 may prevent diffusion of impurities from the substrate 100 to the active pattern ACT. The buffer layer 110 may be formed of an inorganic insulation material such as silicon nitride, silicon oxide, silicon oxynitride, or the like within the spirit and the scope of the disclosure.

The active pattern ACT may be disposed on the buffer layer 110. The active pattern ACT may be formed of amorphous silicon, polycrystalline silicon, an oxide semiconductor, or the like within the spirit and the scope of the disclosure. The active pattern ACT may include a source region SR and a drain region DR in which impurities may be doped, and a channel region CR disposed between the source region SR and the drain region DR.

The first gate insulation layer 120 may be disposed on the buffer layer 110. The first gate insulation layer 120 may cover or overlap the active pattern ACT on the buffer layer 110. The first gate insulation layer 120 may have a substantially uniform thickness along a profile of the active pattern ACT. The first gate insulation layer 120 may be formed of an inorganic insulation material such as silicon nitride, silicon oxide, silicon oxynitride, or the like within the spirit and the scope of the disclosure.

The first gate pattern may be disposed on the first gate insulation layer 120. The first gate pattern may include a gate electrode GE and a first capacitor electrode CE1. The gate electrode GE may overlap the channel region CR of the active pattern ACT. The first gate pattern may be formed of a metal, alloy, conductive metal oxide, conductive metal nitride, a transparent conductive material, or the like within the spirit and the scope of the disclosure. In an embodiment, the first gate pattern may be formed of molybdenum (Mo).

The second gate insulation layer 130 may be disposed on the first gate insulation layer 120. The second gate insulation layer 130 may cover or overlap the first gate pattern on the first gate insulation layer 120. The second gate insulation layer 130 may have a substantially uniform thickness along a profile of the first gate pattern. The second gate insulation layer 130 may be formed of an inorganic insulation material such as silicon nitride, silicon oxide, silicon oxynitride, or the like within the spirit and the scope of the disclosure.

The second gate pattern may be disposed on the second gate insulation layer 130. The second gate pattern may include a second capacitor electrode CE2 and the initialization voltage line. The second capacitor electrode CE2 may overlap the first capacitor electrode CE1. The second gate pattern may be formed of a metal, alloy, conductive metal oxide, conductive metal nitride, a transparent conductive material, or the like within the spirit and the scope of the disclosure. In an embodiment, the second gate pattern may be formed of molybdenum (Mo). The first capacitor electrode CE1 and the second capacitor electrode CE2 may form the capacitor CAP.

The insulation layer 140 may be disposed on the second gate insulation layer 130. The insulation layer 140 may cover or overlap the second gate pattern on the second gate insulation layer 130. The insulation layer 140 may have a substantially uniform thickness along a profile of the second gate pattern. The insulation layer 140 may be formed of an inorganic insulation material such as silicon nitride, silicon oxide, silicon oxynitride, or the like within the spirit and the scope of the disclosure.

The first data pattern may be disposed on the insulation layer 140. The first data pattern may include a source electrode SE and a drain electrode DE. The source electrode SE and the drain electrode DE may be electrically connected to the source region SR and the drain region DR of the active pattern ACT, respectively. The first data pattern may be formed of a metal, alloy, conductive metal oxide, conductive metal nitride, a transparent conductive material, or the like within the spirit and the scope of the disclosure. In an embodiment, the first data pattern may be formed of at least one of aluminum (Al) and titanium (Ti). The active pattern ACT, the gate electrode GE, the source electrode SE, and the drain electrode DE may form the sixth transistor T6. By way of example, only the sixth transistor T6 is illustrated in FIG.

3, however, each of the first transistor T1, the second transistor T2, the third transistor T3, the fourth transistor T4, the fifth transistor T5, and the seventh transistor T7 may have a structure substantially the same as or similar to the sixth transistor T6.

The first planarization layer 150 may be disposed on the insulation layer 140. The first planarization layer 150 may cover or overlap the first data pattern on the insulation layer 140. The first planarization layer 150 may have a substantially flat upper surface without generating a step around the first data pattern. The first planarization layer 150 may be formed of an organic insulation material such as polyimide (PI) or the like within the spirit and the scope of the disclosure.

The second data pattern may be disposed on the first planarization layer 150. The second data pattern may include a connection electrode CE and the data line. The connection electrode CE may be electrically connected to the drain electrode DE. The second data pattern may be formed of a metal, alloy, conductive metal oxide, conductive metal nitride, a transparent conductive material, or the like within the spirit and the scope of the disclosure. In an embodiment, the second data pattern may be formed of at least one of aluminum (Al) and titanium (Ti).

The second planarization layer 160 may be disposed on the first planarization layer 150. The second planarization layer 160 may cover or overlap the second data pattern on the first planarization layer 150. The second planarization layer 160 may have a substantially flat upper surface without generating a step around the second data pattern. The second planarization layer 160 may be formed of an organic insulation material such as polyimide (PI) or the like within the spirit and the scope of the disclosure.

The light-emitting element 180 may include a first electrode 181, an emission layer 182, and a second electrode 183.

The first electrode 181 may be disposed on the second planarization layer 160. The first electrode 181 may be electrically connected to the connection electrode CE. The first electrode 181 may be formed of a metal, alloy, conductive metal oxide, conductive metal nitride, a transparent conductive material, or the like within the spirit and the scope of the disclosure. In an embodiment, the first electrode 181 may be formed of at least one of silver (Ag) and indium tin oxide (ITO).

The pixel defining layer 170 may be disposed on the second planarization layer 160. The pixel defining layer 170 may partially cover or overlap the first electrode 181 on the second planarization layer 160. The pixel defining layer 170 may have an opening exposing at least a portion of the first electrode 181. In an embodiment, the opening of the pixel defining layer 170 may expose a central portion of the first electrode 181, and the pixel defining layer 170 may cover or overlap a peripheral portion of the first electrode 181. The pixel defining layer 170 may be formed of an organic insulation material such as polyimide (PI) or the like within the spirit and the scope of the disclosure.

The emission layer 182 may be disposed on the first electrode 181 exposed by the opening of the pixel defining layer 170. The emission layer 182 may be formed of at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N, N'-diphenylbenzidine), trihydroxyquinoline aluminum (tris-(8-hydroxyquinoline)aluminum), and the like within the spirit and the scope of the disclosure. The high molecular organic compound may include poly ethylenedioxythiophene (poly(3,4-ethylenedioxythiophene), polyaniline, polyphenylenevinylene, polyfluorene, and the like within the spirit and the scope of the disclosure.

In an embodiment, the quantum dot may include a core including a group II-VI compound, a group III-V compound, a group IV-VI compound, a group IV element, a group IV compound, and a combination thereof. In an embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 183 may be disposed on the emission layer 182. In an embodiment, the second electrode 183 may also be disposed on the pixel defining layer 170. The second electrode 183 may be formed of a metal, alloy, conductive metal oxide, conductive metal nitride, a transparent conductive material, or the like within the spirit and the scope of the disclosure. For example, the second electrode 183 may be formed of at least one of aluminum (Al), platinum (Pt), silver (Ag), magnesium (Mg), gold (Au), chromium (Cr), tungsten (W), and titanium (Ti).

The encapsulation layer 190 may cover or overlap the light-emitting element 180. The encapsulation layer 190 may seal the display area DA to protect the light-emitting element 180 from external impurities.

The encapsulation layer 190 may include at least one inorganic encapsulation layer and at least one organic encapsulation layer. In an embodiment, the encapsulation layer 190 may include a first inorganic encapsulation layer 191, a second inorganic encapsulation layer 193 disposed on the first inorganic encapsulation layer 191, and an organic encapsulation layer 192 disposed between the first inorganic encapsulation layer 191 and second inorganic encapsulation layer 193.

The first inorganic encapsulation layer 191 may be disposed on the second electrode 183. The first inorganic encapsulation layer 191 may have a substantially uniform thickness along a profile of the second electrode 183.

The organic encapsulation layer 192 may be disposed on the first inorganic encapsulation layer 191. The organic encapsulation layer 192 may have a substantially flat upper surface without generating a step around the first inorganic encapsulation layer 191.

The second inorganic encapsulation layer 193 may be disposed on the organic encapsulation layer 192. The second inorganic encapsulation layer 193 may have a substantially uniform thickness, and may have a substantially flat upper surface.

Figure 4:
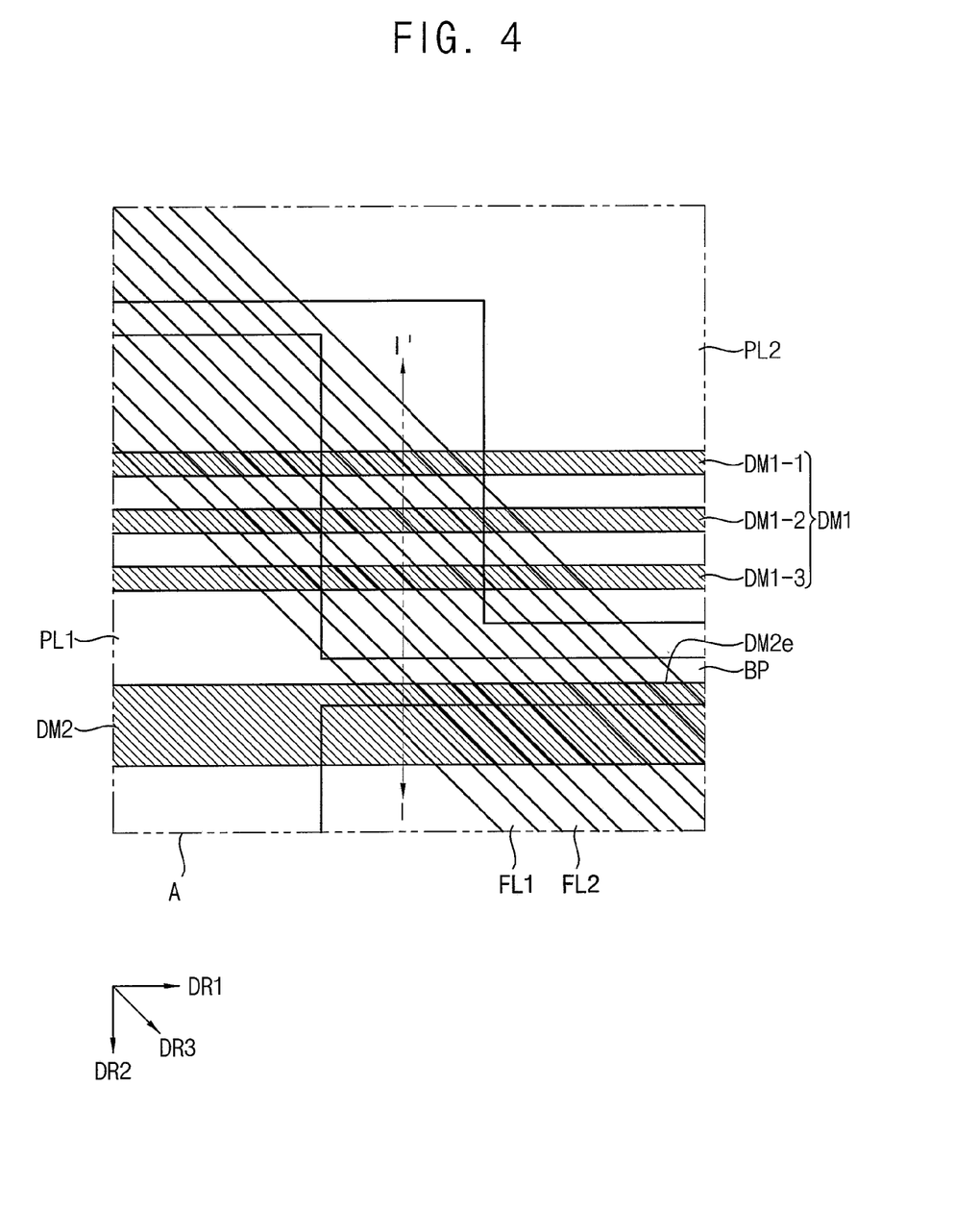
FIG. 4 is a plan view illustrating a peripheral area according to an embodiment.
Figure 5:
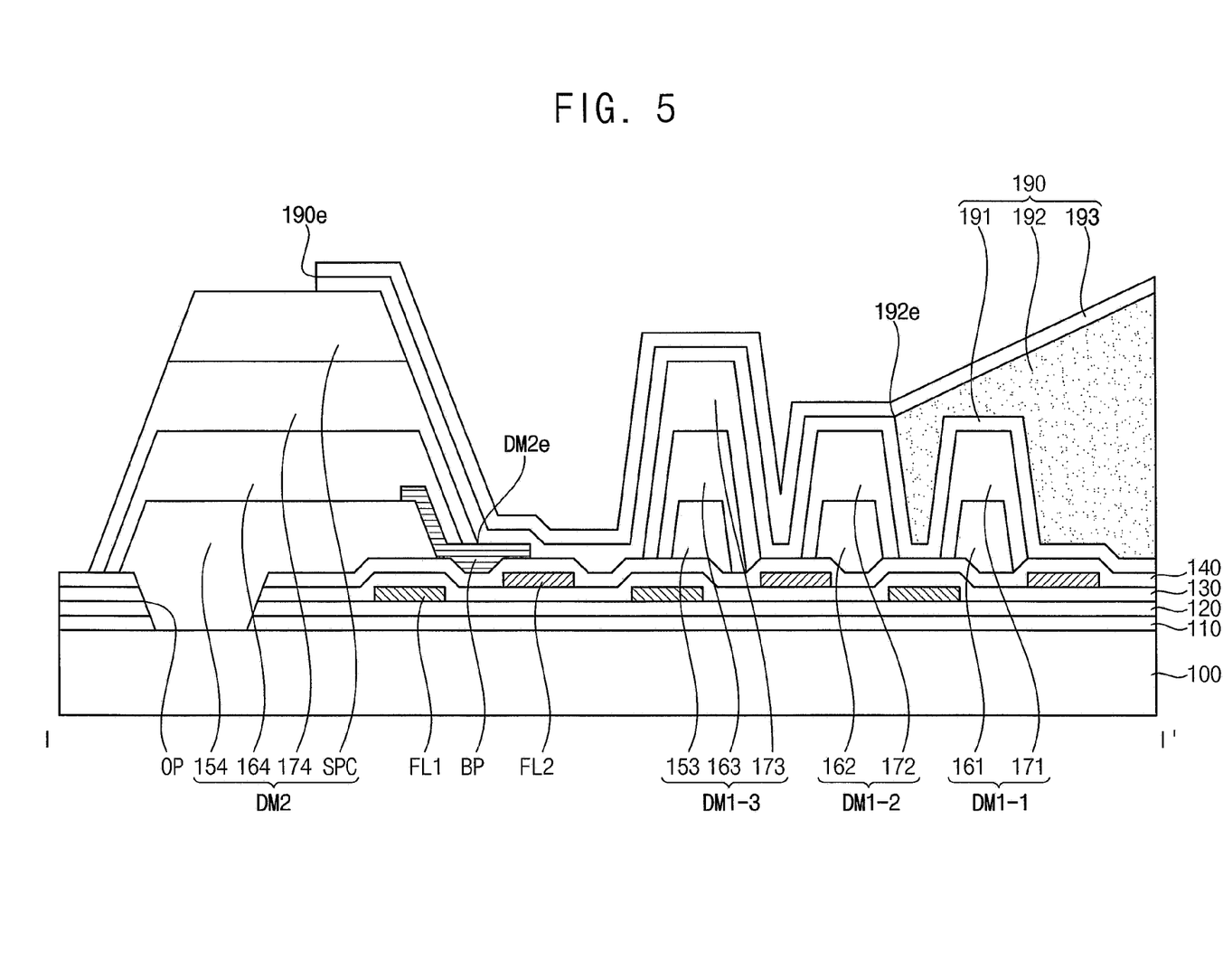
FIG. 5 is a schematic cross-sectional view taken along a line I-I' in FIG. 4.

FIG. 4 is a plan view illustrating a peripheral area according to an embodiment. For example, FIG. 4 may illustrate an example of an area A in FIG. 1. FIG. 5 is a schematic cross-sectional view taken along a line I-I' in FIG. 4.

Referring to FIGS. 1, 4, and 5, the display device may include the substrate 100, the buffer layer 110, the first gate insulation layer 120, the second gate insulation layer 130, fan-out lines, the insulation layer 140, a first power line PL1, a second power line PL2, a blocking pattern BP, at least one first dam DM1, a second dam DM2, and the encapsulation layer 190 which may be disposed in the peripheral area PA.

The buffer layer 110 may be disposed on the substrate 100. The first gate insulation layer 120 may be disposed on the buffer layer 110. The second gate insulation layer 130 may be disposed on the first gate insulation layer 120.

The fan-out lines may be disposed on the same layer as at least one of the first gate pattern and the second gate pattern. The fan-out lines may include first fan-out lines FL1 and second fan-out lines FL2. The first fan-out lines FL1 may be disposed on the same layer as the first gate pattern, and the second fan-out lines FL2 may be disposed on the same layer as the second gate pattern.

The first fan-out lines FL1 and the second fan-out lines FL2 may extend along a third direction DR3 between the first direction DR1 and the second direction DR2. The first fan-out lines FL1 and the second fan-out lines FL2 may not overlap each other in a plan view.

The insulation layer 140 may be disposed on the second gate insulation layer 130. The insulation layer 140 may cover or overlap the second fan-out lines FL2 on the second gate insulation layer 130.

The first power line PL1 and the second power line PL2 may be disposed on the insulation layer 140. Each of the first power line PL1 and the second power line PL2 may be disposed on the same layer as at least one of the first data pattern and the second data pattern.

The first dam DM1 and the second dam DM2 may be disposed on the insulation layer 140. The first dam DM1 and the second dam DM2 may cover or overlap the first power line PL1 and the second power line PL2 on the insulation layer 140.

In an embodiment, the first dam DM1 may include a 1-1st dam DM1-1, a 1-2nd dam DM1-2, and 1-3rd dam DM1-3. FIGS. 4 and 5 illustrate that the first dam DM1 may include three dams, however, the disclosure is not limited thereto, and in an embodiment, the first dam DM1 may include two or four or more dams.

The 1-1st dam DM1-1 may surround the display area DA. The 1-2nd dam DM1-2 may be spaced apart from the 1-1st dam DM1-1, and may surround the 1-1st dam DM1-1. The 1-3rd dam DM1-3 may be spaced apart from the 1-2nd dam DM1-2, and may surround the 1-2nd dam DM1-2.

The second dam DM2 may be spaced apart from the first dam DM1, and may surround or be adjacent to the first dam DM1. For example, the second dam DM2 may be spaced apart from the 1-3rd dam DM1-3, and may surround or be adjacent to the 1-3rd dam DM1-3.

The 1-1st dam DM1-1 may include a first portion 161 and a second portion 171 disposed on the first portion 161. The first portion 161 may be formed of substantially the same or similar material as the second planarization layer 160, and may be formed substantially together with the second planarization layer 160. The second portion 171 may be formed of substantially the same or similar material as the pixel defining layer 170, and may be formed substantially together with the pixel defining layer 170.

The 1-2nd dam DM1-2 may include a first portion 162 and a second portion 172 disposed on the first portion 162. The first portion 162 may be formed of substantially the same or similar material as the second planarization layer 160, and may be formed substantially together with the second planarization layer 160. The second portion 172 may be formed of substantially the same or similar material as the pixel defining layer 170, and may be formed substantially together with the pixel defining layer 170.

The 1-3rd dam DM1-3 may include a first portion 153, a second portion 163 disposed on the first portion 153, and a third portion 173 disposed on the second portion 163. The first portion 153 may be formed of substantially the same or similar material as the first planarization layer 150, and may be formed substantially together with the first planarization layer 150. The second portion 163 may be formed of substantially the same or similar material as the second planarization layer 160, and may be formed substantially together with the second planarization layer 160. The third portion 173 may be formed of substantially the same or similar material as the pixel defining layer 170, and may be formed substantially together with the pixel defining layer 170.

The second dam DM2 may include a first portion 154, a second portion 164 disposed on the first portion 154, a third portion 174 disposed on the second portion 164, and a fourth portion SPC disposed on the third portion 174. The first portion 154 may be formed of substantially the same or similar material as the first planarization layer 150, and may be formed substantially together with the first planarization layer 150. The second portion 164 may be formed of substantially the same or similar material as the second planarization layer 160, and may be formed substantially together with the second planarization layer 160. The third portion 174 may be formed of substantially the same or similar material as the pixel defining layer 170, and may be formed substantially together with the pixel defining layer 170. The fourth portion SPC may be formed of substantially the same or similar material as the third portion 174, and may be formed substantially together with or independently from the third portion 174.

The encapsulation layer 190 may be disposed on the insulation layer 140. The encapsulation layer 190 may cover or overlap the first dam DM1 and at least a portion of the second dam DM2 on the insulation layer 140.

An edge 192e of the organic encapsulation layer 192 may be disposed on or may abut the first dam DM1. In other words, the edge 192e of the organic encapsulation layer 192 may be closer to the display area DA than an edge of the first dam DM1 which may be adjacent to the second dam DM2. Accordingly, the first dam DM1 may prevent an organic material of the organic encapsulation layer 192 from being overflowed outside the first dam DM1.

An edge 190e of the encapsulation layer 190 may be disposed on or may abut the second dam DM2. In other words, an edge of the first inorganic encapsulation layer 191 and/or an edge of the second inorganic encapsulation layer 193 may be disposed on the second dam DM2. Accordingly, the second dam DM2 may prevent the first inorganic encapsulation layer 191 and the second inorganic encapsulation layer 193 from being formed outside the second dam DM2. Because the edge 192e of the organic encapsulation layer 192 may be disposed on the first dam DM1, only the first inorganic encapsulation layer 191 and the second inorganic encapsulation layer 193 may be disposed between the first dam DM1 and the second dam DM2. In other words, the organic encapsulation layer 192 may not be disposed between the first dam DM1 and the second dam DM2.

In an embodiment, an opening OP that may overlap the second dam DM2 may be formed in the buffer layer 110, the first gate insulation layer 120, the second gate insulation layer 130, and the insulation layer 140. The second dam DM2 may fill the opening OP. A bending area in which the display device may be bent may be formed in the opening OP. In a case that the buffer layer 110, the first gate insulation layer 120, the second gate insulation layer 130, and the insulation layer 140, which may be formed of an inorganic insulation material, may be bent in the bending area, cracks may occur in the buffer layer 110, the first gate insulation layer 120, the second gate insulation layer 130, and the insulation layer 140. However, in an embodiment, because the opening OP that may overlap the second dam DM2 may be formed in the buffer layer 110, the first gate insulation layer 120, the second gate insulation layer 130, and the insulation layer 140, only the second dam DM2, which may be formed of an organic insulation material, may be disposed in the opening OP. Accordingly, the cracks may not occur in the buffer layer 110, the first gate insulation layer 120, the second gate insulation layer 130, and the insulation layer 140.

The blocking pattern BP may be disposed between the insulation layer 140 and an edge DM2e of the second dam DM2 which may be adjacent to the first dam DM1. The blocking pattern BP may be disposed between the fan-out lines and the second dam DM2, and may overlap the edge DM2e of the second dam DM2 which may be adjacent to the first dam DM1.

A material of the blocking pattern BP may be different from a material of each of the fan-out lines. In an embodiment, the blocking pattern BP may be formed of at least one of aluminum (Al) and titanium (Ti), and the fan-out lines may be formed of molybdenum (Mo).

As described above, only the first inorganic encapsulation layer 191 and the second inorganic encapsulation layer 193 may be disposed between the first dam DM1 and the second dam DM2, and cracks may occur in the first inorganic encapsulation layer 191 and the second inorganic encapsulation layer 193 on the edge DM2e of the second dam DM2 which may be adjacent to the first DM1 in a case that external pressure may be applied to the peripheral area PA of the display device in the process of manufacturing the display device. The fan-out lines may be corroded in a case that moisture flows into the display device from outside through the cracks, and then, the moisture may be transferred to the fan-out lines disposed under or below the edge DM2e of the second dam DM2. However, in an embodiment, the blocking pattern BP that may overlap the edge DM2e of the second dam DM2 in a plan view may be disposed between the fan-out lines and the second dam DM2, so that the moisture that may flow into through the cracks may not be transferred to the fan-out lines.

In an embodiment, the second dam DM2 may contact the blocking pattern BP. For example, a lower surface of the second dam DM2 may contact an upper surface of the blocking pattern BP. In a case that the second dam DM2 formed of an organic insulation material may be formed or disposed directly on the insulation layer 140 formed of an inorganic insulation material, an adhesion between the second dam DM2 and the insulation layer 140 may be relatively small, therefore, the second dam DM2 may be separated from the insulation layer 140. However, in an embodiment, because the second dam DM2 contacts the blocking pattern BP, the adhesion between the second dam DM2 and the insulation layer 140 may increase, so that the second dam DM2 may not be separated from the insulation layer 140.

The blocking pattern BP may be electrically connected to the first power line PL1. The blocking pattern BP may be spaced apart from the second power line PL2. In a case that the blocking pattern BP is not electrically connected to the first power line PL1 (in other words, in a case that the blocking pattern BP has an island or isolated shape in a plan view), the display device may be damaged due to generation of static electricity in the blocking pattern BP. However, because the blocking pattern BP is electrically connected to the first power line PL1 transmitting the first power voltage, the static electricity may not occur in the blocking pattern BP.

The blocking pattern BP may protrude from the first power line PL1 in a plan view. For example, the blocking pattern BP may protrude along the first direction DR1 from a portion of the first power line PL1 which may overlap the edge DM2e of the second dam DM2.

In an embodiment, the blocking pattern BP may be disposed on the same layer as the first power line PL1. For example, the blocking pattern BP and the first power line PL1 may be formed of substantially the same or similar material as the second data pattern, and may be formed together with the second data pattern. In an embodiment, the blocking pattern BP may be integrally formed with the first power line PL1.

Figure 6:
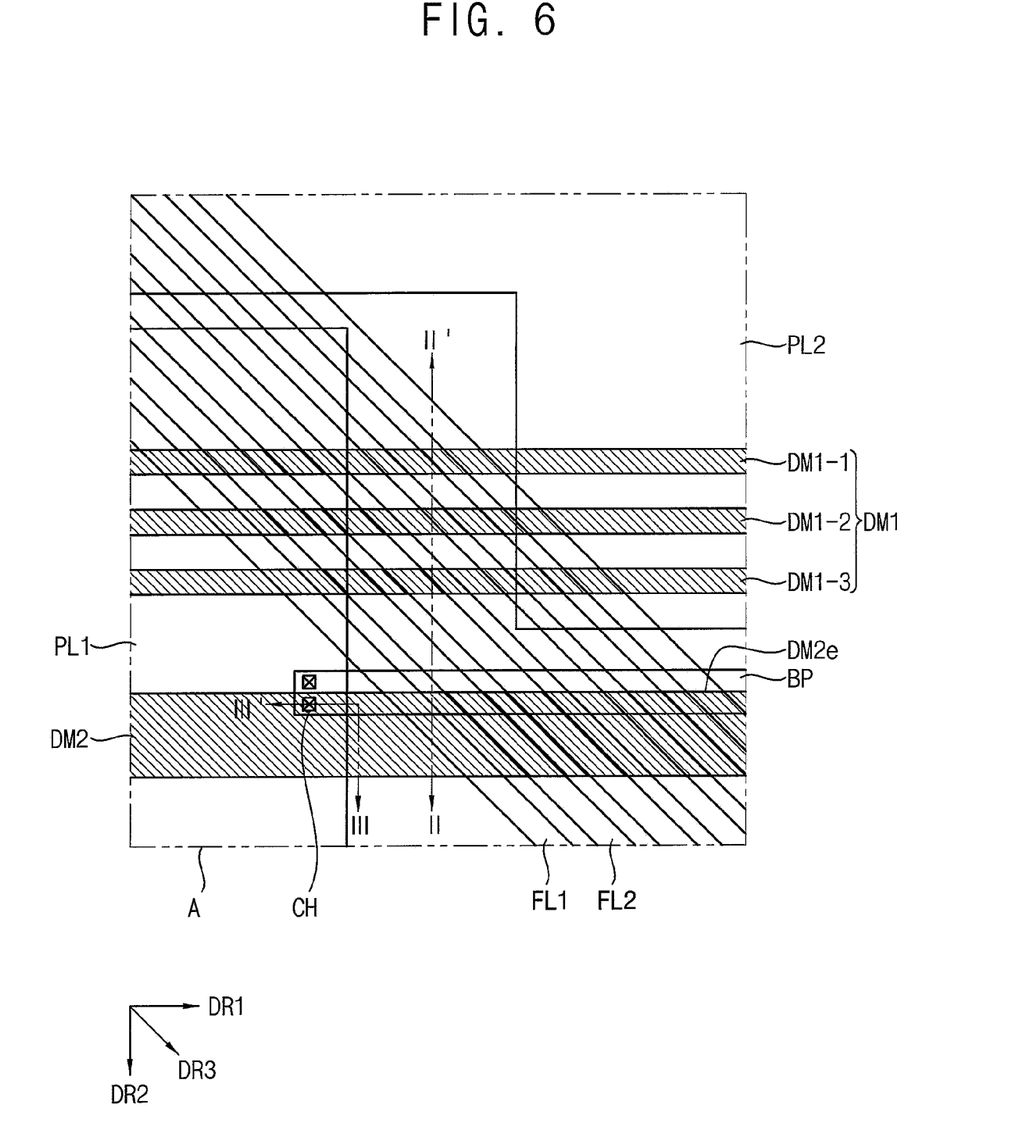
FIG. 6 is a plan view illustrating a peripheral area according to an embodiment.
Figure 7:
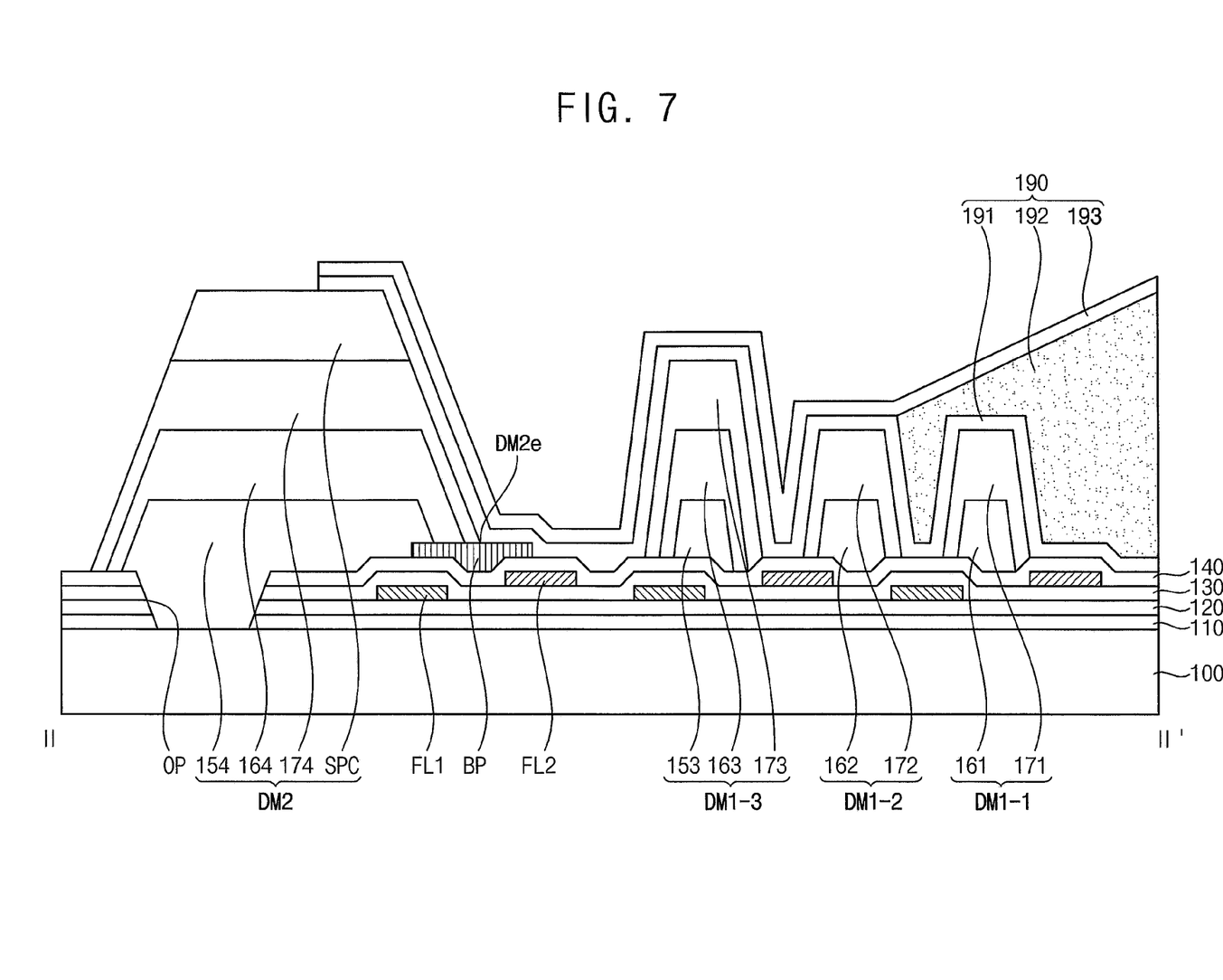
FIG. 7 is a schematic cross-sectional view taken along a line II-IF in FIG. 6.
Figure 8:
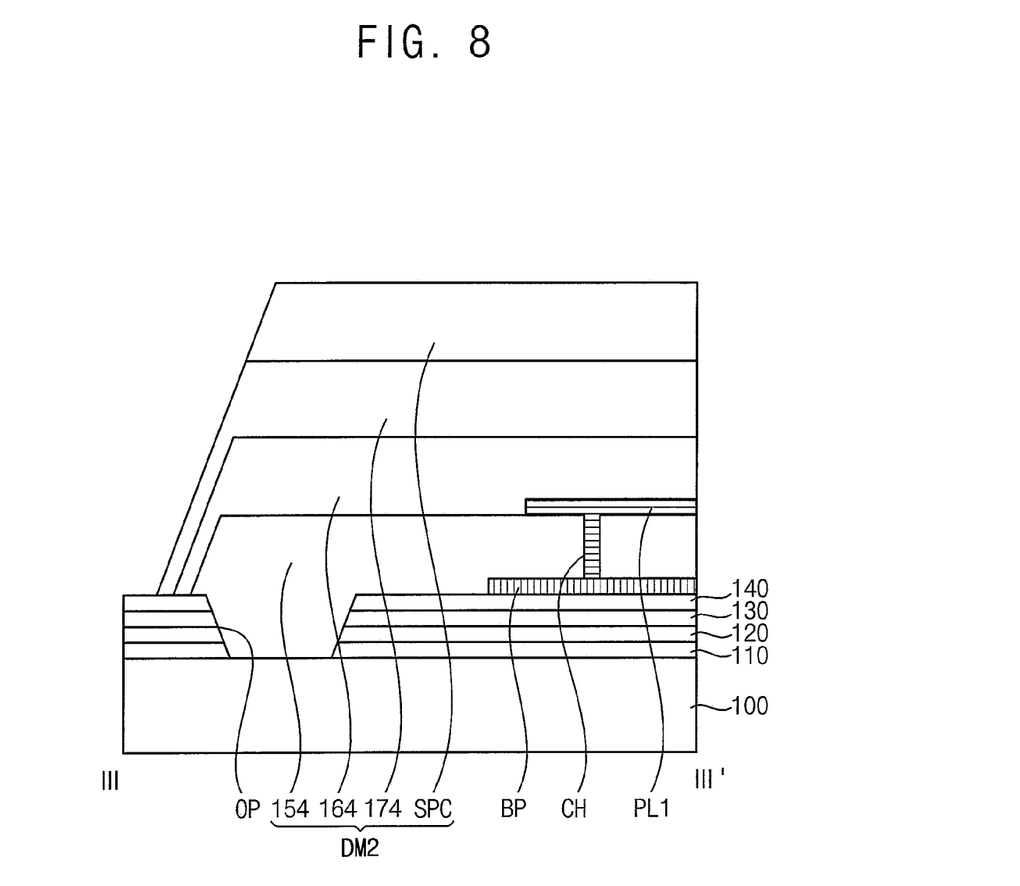
FIG. 8 is a schematic cross-sectional view taken along a line in FIG. 6.

FIG. 6 is a plan view illustrating a peripheral area according to an embodiment. For example, FIG. 6 may illustrate another example of the area A in FIG. 1. FIG. 7 is a schematic cross-sectional view taken along a line II-IF in FIG. 6. FIG. 8 is a schematic cross-sectional view taken along a line in FIG. 6.

Referring to FIGS. 1, 6, 7, and 8, a display device according to an embodiment may include a substrate 100, a buffer layer 110, a first gate insulation layer 120, a second gate insulation layer 130, fan-out lines, an insulation layer 140, a first power line PL1, a second power line PL2, a blocking pattern BP, at least one first dam DM1, a second dam DM2, and the encapsulation layer 190 which may be disposed in the peripheral area PA. The display device described with reference to FIGS. 1, 6, 7, and 8 may be substantially the same as or similar to the display device described with reference to FIGS. 1, 4, and 5 except for a disposition of the blocking pattern BP. Accordingly, repeated descriptions will be omitted.

In an embodiment, the blocking pattern BP may be disposed on a different layer from the first power line PL1. For example, the blocking pattern BP may be formed of substantially the same or similar material as the first data pattern, and may be formed substantially together with the first data pattern, and the first power line PL1 may be formed of substantially the same or similar material as the second data pattern, and may be formed substantially together with the second data pattern.

In an embodiment, the blocking pattern BP may be electrically connected to the first power line PL1 through a contact hole CH. For example, the contact hole CH may be formed in the first portion 154 of the second dam DM2 in which the blocking pattern BP and the first power line PL1 may overlap each other in a plan view, and the first power line PL1 may be connected electrically to the blocking pattern BP through the contact hole CH.

The display device according to the embodiments may be applied to a display device included in a computer, a notebook, a mobile phone, a smartphone, a smart pad, a PMP, a PDA, an MP3 player, or the like within the spirit and the scope of the disclosure.

Although the display devices according to embodiments have been described with reference to the drawings, the illustrated embodiments are examples, and may be modified and changed by a person having ordinary skill in the art without departing from the technical spirit described in the following claims.

What is claimed is:
1. A display device, comprising:
a substrate including a display area and a peripheral area adjacent to the display area;
fan-out lines disposed in the peripheral area of the substrate;
an insulation layer disposed on the fan-out lines;

at least one first dam disposed on the insulation layer in the peripheral area, the at least one first dam surrounding the display area;

a second dam disposed on the insulation layer in the peripheral area, the second dam surrounding the at least one first dam; and a blocking pattern disposed on the insulation layer and confined between an outer edge of the at least one first dam and a center of the second damn as seen in a side view, wherein an inner edge of the second dam overlaps an outer edge of the blocking pattern as seen in plan view, and an inner edge of the blocking pattern is spaced apart from the outer edge of and outermost first dam as seen in plan view.

2. The display device of claim 1, wherein a material of the blocking pattern is different from a material of the fan-out lines.

3. The display device of claim 2, wherein
the blocking pattern includes at least one of aluminum (Al) and titanium (Ti), and
the fan-out lines include molybdenum (Mo).

4. The display device of claim 1, further comprising:
a light-emitting element disposed on the substrate in the display area; and
an encapsulation layer overlapping the light-emitting element, the at least one first dam, and at least a portion of the second dam, the encapsulation layer including:
a first inorganic encapsulation layer;
a second inorganic encapsulation layer disposed on the first inorganic encapsulation layer; and
an organic encapsulation layer disposed between the first inorganic encapsulation layer and the second inorganic encapsulation layer.

5. The display device of claim 4, wherein the first inorganic encapsulation layer and the second inorganic encapsulation layer are disposed between the at least one first dam and the second dam.

6. The display device of claim 5, wherein a distal edge of the encapsulation layer is disposed on the second dam.

7. The display device of claim 5, wherein an edge of the organic encapsulation layer is disposed on the at least one first dam.

8. The display device of claim 4, further comprising:
an active pattern disposed on the substrate in the display area;
a first gate pattern disposed on the active pattern;
a second gate pattern disposed on the first gate pattern;
a first data pattern disposed on the second gate pattern; and
a second data pattern disposed between the first data pattern and the light-emitting element.

9. The display device of claim 8, wherein the blocking pattern and at least one of the first data pattern and the second data pattern are directly disposed on a same layer.

10. The display device of claim 8, wherein the fan-out lines and at least one of the first gate pattern and the second gate pattern are directly disposed on a same layer.

11. The display device of claim 1, wherein the second dam penetrates the insulation layer to directly contact the substrate.

12. The display device of claim 1, wherein
the second dam comprises multiple layers, and
a bottom surface of the blocking pattern directly contacts a top surface of a lower layer of the second dam.

13. The display device of claim 1, wherein
the second dam comprises multiple layers, and
a top surface of the blocking pattern directly contacts a bottom surface of a lower layer of the second dam.

14. A display device, comprising:
a substrate including a display area and a peripheral area adjacent to the display area;
fan-out lines disposed in the peripheral area of the substrate;
at least one first dam disposed on the fan-out lines in the peripheral area, the at least one first dam surrounding the display area;
a second dam disposed on the fan-out lines in the peripheral area, the second dam surrounding the at least one first dam; and
a blocking pattern disposed on the fan-out lines and confined between an outer edge of the at least one first dam and a center of the second damn as seen in a side view, wherein
an inner edge of the second dam overlaps an outer edge of the blocking pattern as seen in plan view, and
an inner edge of the blocking pattern is spaced apart from the outer edge of and outermost first dam as seen in plan view.

15. The display device of claim 14, further comprising:
a first power line disposed on the substrate in the peripheral area, wherein
the blocking pattern is electrically connected to the first power line.

16. The display device of claim 15, wherein the blocking pattern and the first power line are directly disposed on a same layer.

17. The display device of claim 16, wherein the blocking pattern is integral with the first power line.

18. The display device of claim 15, wherein the blocking pattern and the first power line are disposed on different layers.

19. The display device of claim 18, wherein the blocking pattern is electrically connected to the first power line through a contact hole.

20. The display device of claim 15, wherein the blocking pattern protrudes from the first power line in the plan view.

21. The display device of claim 15, further comprising:
a second power line disposed on the substrate in the peripheral area,
wherein the blocking pattern is spaced apart from the second power line.

22. The display device of claim 14, further comprising:
a light-emitting element disposed on the substrate in the display area; and
an encapsulation layer overlapping the light-emitting element, the at least one first dam, and at least a portion of the second dam, the encapsulation layer including:
a first inorganic encapsulation layer;
a second inorganic encapsulation layer disposed on the first inorganic encapsulation layer; and
an organic encapsulation layer disposed between the first inorganic encapsulation layer and the second inorganic encapsulation layer,
wherein the first inorganic encapsulation layer and the second inorganic encapsulation layer are disposed between the at least one first dam and the second dam.

23. The display device of claim 14, wherein
the blocking pattern is disposed directly over at least one of the fan-out lines.

* * * * *